United States Patent
Hou et al.

(10) Patent No.: US 10,762,945 B2
(45) Date of Patent: Sep. 1, 2020

(54) MEMORY DEVICE AND REFRESH METHOD FOR PSRAM

(71) Applicant: Winbond Electronics Corp., Taichung (TW)

(72) Inventors: Chien-Ti Hou, Chiayi (TW); Ying-Te Tu, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/424,990

(22) Filed: May 29, 2019

(65) Prior Publication Data
US 2020/0075086 A1 Mar. 5, 2020

(30) Foreign Application Priority Data
Sep. 4, 2018 (TW) .............................. 107130988 A

(51) Int. Cl.
*G11C 11/406* (2006.01)
*G11C 11/22* (2006.01)

(52) U.S. Cl.
CPC .... *G11C 11/40603* (2013.01); *G11C 11/2257* (2013.01); *G11C 11/40615* (2013.01)

(58) Field of Classification Search
CPC ................................ G11C 11/406; G11C 8/10
USPC ............................................. 365/222, 230.06
See application file for complete search history.

(56) References Cited

U.S. PATENT DOCUMENTS

| | | | |
|---|---|---|---|
| 6,821,068 B2 | 11/2004 | Facey et al. | |
| 7,000,846 B2 * | 2/2006 | Hakushi | G11C 7/1006 235/492 |
| 7,170,808 B2 * | 1/2007 | Hokenmaier | G11C 11/406 365/149 |
| 7,266,032 B2 * | 9/2007 | Suh | G11C 11/406 365/149 |
| 7,366,047 B2 * | 4/2008 | Bowyer | G11C 7/12 365/203 |
| 2004/0066686 A1 * | 4/2004 | Jakobs | G11C 11/406 365/202 |
| 2006/0285412 A1 * | 12/2006 | Hummler | G06F 11/106 365/222 |
| 2009/0116288 A1 * | 5/2009 | Varkony | G11C 5/145 365/185.13 |
| 2010/0128539 A1 * | 5/2010 | Kobayashi | G11C 11/4096 365/189.05 |
| 2011/0205832 A1 * | 8/2011 | Jeon | G11C 7/222 365/233.16 |
| 2012/0137040 A1 * | 5/2012 | Kim | H01L 25/0657 710/308 |
| 2012/0147692 A1 * | 6/2012 | Nakamura | G11C 7/1066 365/233.1 |

(Continued)

*Primary Examiner* — Michael T Tran

(74) *Attorney, Agent, or Firm* — Muncy, Geissler, Olds & Lowe, P.C.

(57) ABSTRACT

A memory device is provided. The memory device includes a pseudo static random access memory (PSRAM), a word line (WL) arbitrator and a refresh controller. The WL arbitrator receives a WL signal and segments the WL signal according to a burst length setting value, to obtain a segmented WL signal. In a synchronous mode, the refresh controller provides a first refresh trigger signal corresponding to the WL signal to refresh the PSRAM. In a smart refresh mode, the refresh controller provides a second refresh trigger signal corresponding to the segmented WL signal to refresh the PSRAM.

9 Claims, 7 Drawing Sheets

(56) References Cited

U.S. PATENT DOCUMENTS

| | | | | |
|---|---|---|---|---|
| 2012/0155206 A1* | 6/2012 | Kodama | ............... | H03K 5/13 |
| | | | | 365/222 |
| 2012/0296876 A1* | 11/2012 | Bacinschi | ........... | G06F 11/3006 |
| | | | | 707/687 |
| 2012/0314767 A1* | 12/2012 | Wang | ................... | H04N 19/105 |
| | | | | 375/240.12 |
| 2014/0189229 A1* | 7/2014 | Schoenborn | ......... | G11C 29/023 |
| | | | | 711/106 |
| 2017/0039103 A1* | 2/2017 | Engin | .................... | G11C 29/52 |
| 2017/0115930 A1* | 4/2017 | Coteus | ................... | G11C 7/109 |
| 2017/0287549 A1* | 10/2017 | Lee | ..................... | G11C 11/4091 |
| 2017/0352404 A1* | 12/2017 | Lee | ...................... | G11C 11/408 |
| 2019/0122723 A1* | 4/2019 | Ito | ..................... | G11C 11/40618 |

* cited by examiner

MEMORY DEVICE AND REFRESH METHOD FOR PSRAM

CROSS REFERENCE TO RELATED APPLICATIONS

This Application claims priority of Taiwan Patent Application No. 107130988, filed on Sep. 4, 2018, the entirety of which is incorporated by reference herein.

BACKGROUND OF THE INVENTION

Field of the Invention

The invention relates to a pseudo static random access memory (PSRAM), and more particularly to a refresh method of a PSRAM.

Description of the Related Art

When performing a burst read/write operation, the PSRAM device may require a long time to start the word line to access the memory cells in the array. If the PSRAM device is operating at a low frequency (such as Internet of Things (IoT) applications), the read/write operations will be interrupted by periodic refresh operations, thus reducing the efficiency of burst access and increasing power consumption, and even the PSRAM device can't be used at low frequencies.

BRIEF SUMMARY OF THE INVENTION

Memory devices and refresh method for a pseudo static random access memory (PSRAM) are provided. An embodiment of a memory device is provided. The memory device includes a pseudo static random access memory (PSRAM), a word line arbitrator, and a refresh controller. The word line arbitrator receives a word line signal, and segments the word line signal according to a burst length setting value, to obtain a segmented word line signal. The refresh controller provides a first refresh trigger signal corresponding to the word line signal to refresh the PSRAM in a synchronous mode, and provides a second refresh trigger signal corresponding to the segmented word line signal to refresh the PSRAM in a smart refresh mode.

Furthermore, an embodiment of a refresh method for a pseudo static random access memory (PSRAM) is provided. In response to a burst length setting value, a segmented word line signal is provided according to a word line signal. A first refresh trigger signal corresponding to the word line signal or a second refresh trigger signal corresponding to the segmented word line signal is selectively provided to refresh the PSRAM. The number of pulses of the segmented word line signal is determined by the burst length setting value.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
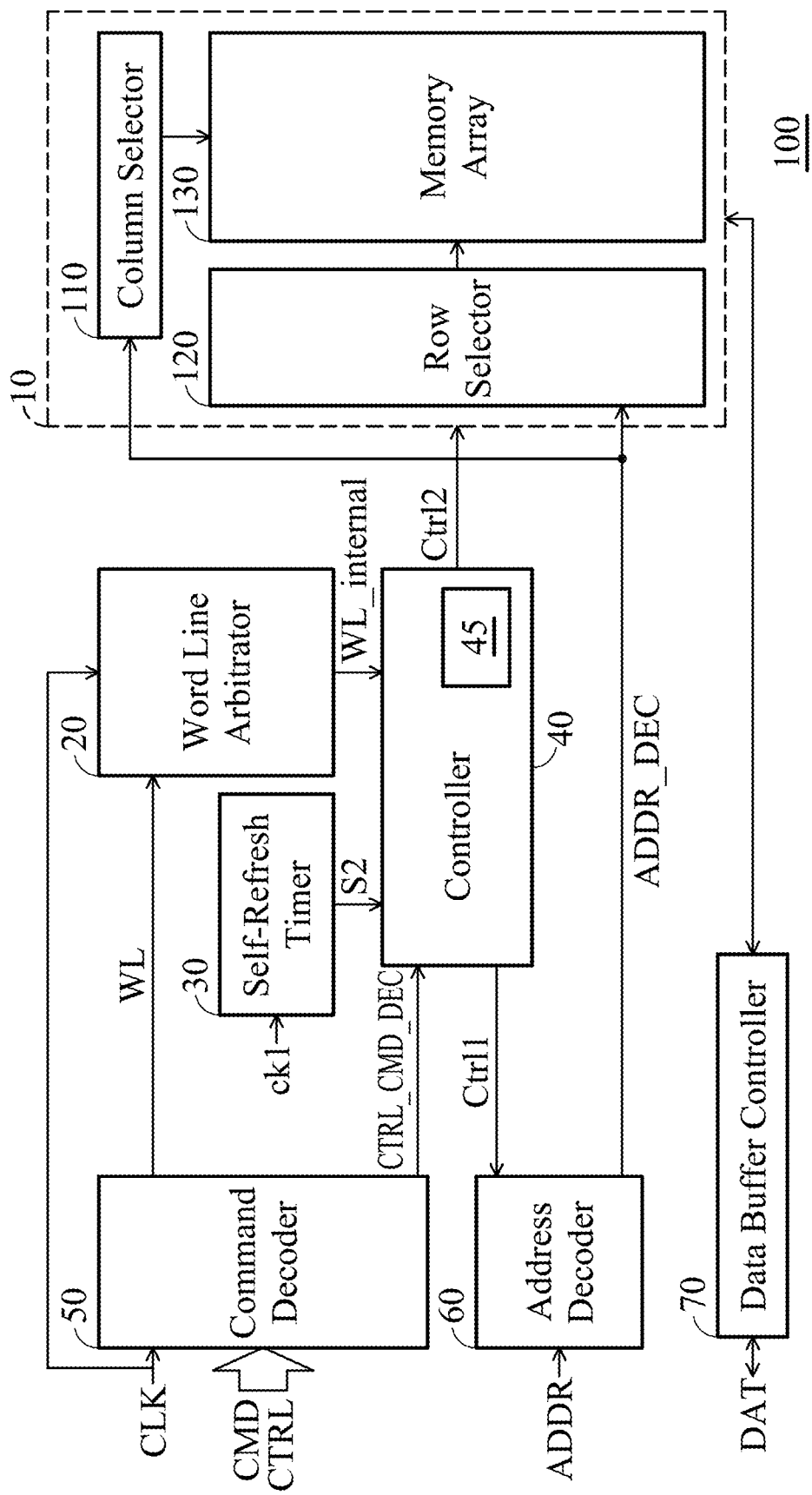
FIG. 1 shows a memory device according to an embodiment of the invention.

FIG. 1 shows a memory device 100 according to an embodiment of the invention. The memory device 100 includes a pseudo static random access memory (PSRAM) 10, a word line (WL) arbitrator 20, a self-refresh timer 30, a controller 40, a command decoder 50, an address decoder 60, and a data buffer controller 70. The memory device 100 includes a column selector 110, a row selector 120 and a memory array 130 formed by a plurality of PSRAM cells.

The command decoder 50 is configured to receive a clock signal CLK, the command information CMD, and the control information CTRL from a processor (e.g., an external processor or an internal host processor), and generates a word line signal WL and the data CTRL_CMD_DEC corresponding to the command information CMD and the control information CTRL. In some embodiments, the control information CTRL includes control signals such as a chip enable signal CE (or a chip select signal CS), an output enable signal OE, and the like. Furthermore, the processor performs the read operations and the write operations on the PSRAM 10 in response to the clock signal CLK. In order to simplify the description, the operation clock signals in the memory device 100 will be omitted.

The address decoder 60 is configured to decode the address information ADDR from the processor according to the signal Ctrl1 from the controller 40, so as to provide the decoded address signal ADDR_DEC to the column selector 110 and the row selector 120 of the PSRAM 10. Thus, the column selector 110 and the row selector 120 address the memory array 130 according to the address signal ADDR_DEC, so as to perform the corresponding operations, such as the read and write operations. In some embodiments, the address decoder 60 includes an address counter (not shown) for counting the received address information ADDR.

The data buffer controller 70 is configured to buffer the data DAT. For example, when a write operation is performed, the data buffer controller 70 buffers the data DAT from the data bus (not shown) and provides the buffered data DAT to the PSRAM 10. Conversely, when a read operation is performed, the data buffer controller 70 buffers the data DAT from the PSRAM 10 and provides the buffered data DAT to the data bus.

The WL arbitrator 20 is configured to provide an internal word line signal WL_internal to the controller 40 according to the clock signal CLK and the word line signal WL from the command decoder 50. According to the frequency of the clock signal CLK or the setting of the register corresponding to a smart refresh function, the memory device 100 is capable of operating in a synchronous mode or a smart refresh mode. In the synchronous mode, the internal word line signal WL_internal provided by the WL arbitrator 20 is synchronized to the word line signal WL. For example, the internal word line signal WL_internal is the same or similar to the word line signal WL. Conversely, in the smart refresh mode, the internal word line signal WL_internal provided by the WL arbitrator 20 is asynchronous to the word line signal WL. For example, the waveform of the internal word line signal WL_internal is different from the word line signal WL. The operation of the synchronous mode and the smart refresh mode will be described below.

The self-refresh timer 30 is configured to count the time based on the clock signal ck1 within the memory device 100. In some embodiments, the clock signal ck1 is provided by the internal oscillator of the memory device 100. When the predetermined time of self-refresh is counted, the self-refresh timer 30 provides a signal S2 to issue a refresh request to the controller 40 and then re-counts. In some embodiments, the frequency of the clock signal ck1 is independent of the outside clock signal CLK.

The controller 40 is configure to generate a control signal Ctrl2 to read, write or refresh the PSRAM 10 according to the signal S2, the internal word line signal WL_internal, and the data CTRL_CMD_DEC. The controller 40 includes a refresh trigger circuit 45. In the synchronous mode, the refresh trigger circuit 45 notifies the controller 40 to perform a refresh operation on the PSRAM 10 after completing the read or write operation of the PSRAM 10. Conversely, in the smart refresh mode, the refresh trigger circuit 45 notifies the controller 40 to refresh the PSRAM 10 during the read or write operation of the PSRAM 10. In some embodiments, the WL arbitrator 20 and the self-refresh timer 30 are implemented in the controller 40.

Figure 2:
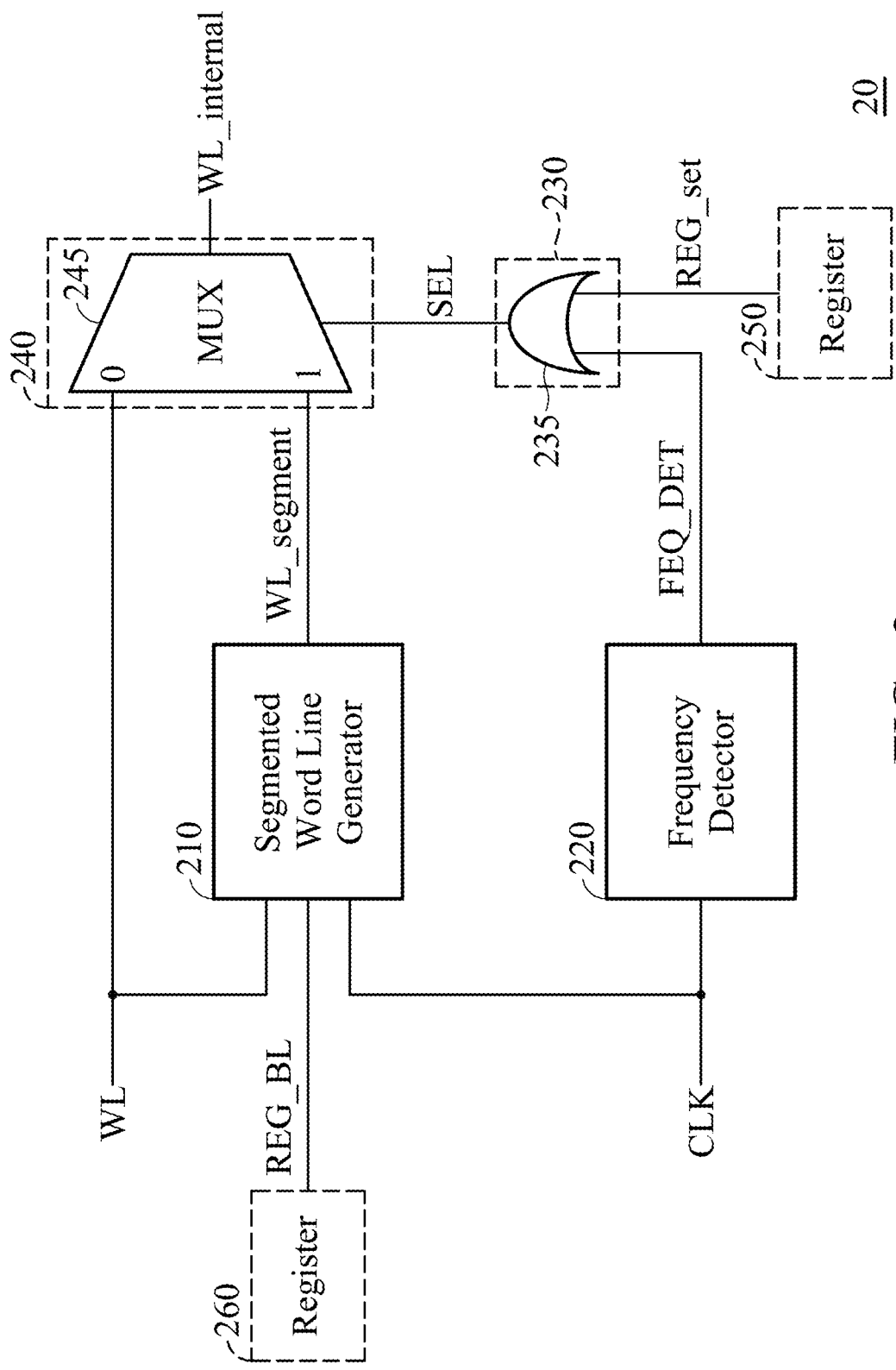
FIG. 2 shows the WL arbitrator of FIG. 1 according to an embodiment of the invention.

FIG. 2 shows the WL arbitrator 20 of FIG. 1 according to an embodiment of the invention. In the embodiment, the WL arbitrator 20 includes a segmented word line generator 210, a frequency detector 220, an operation unit 230, and a selector 240. The segmented word line generator 210 is configured to provide a segmented word line signal WL_segment according to the word line signal WL and the clock signal CLK.

Figure 3:
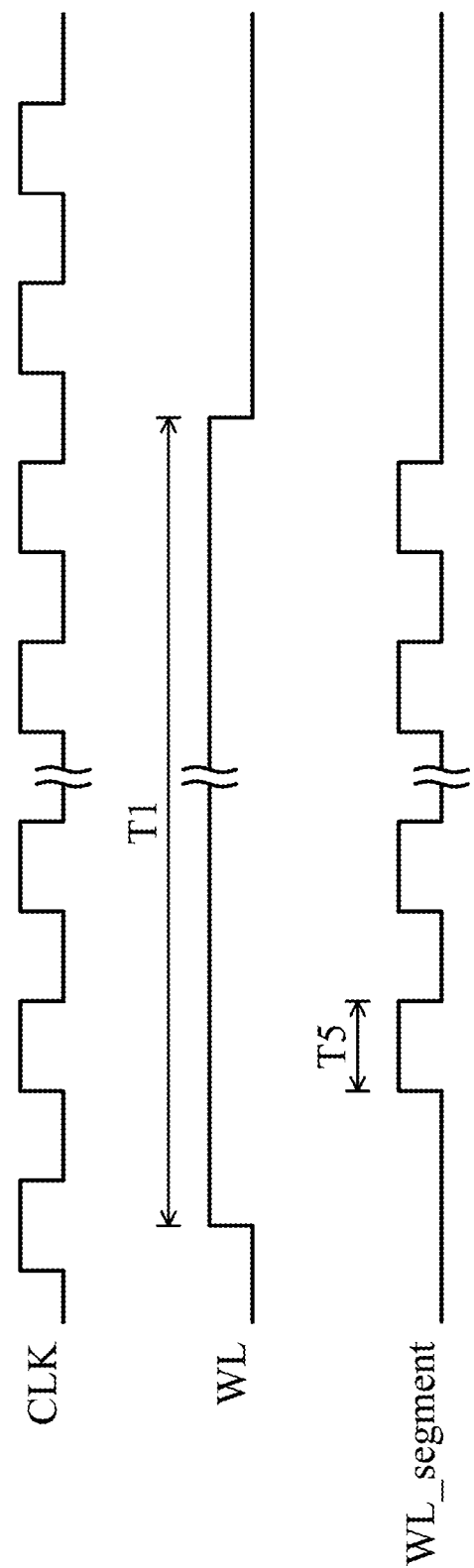
FIG. 3 shows an exemplary waveform diagram of the signals of the segmented word line generator in FIG. 2.

FIG. 3 shows an exemplary waveform diagram of the signals of the segmented word line generator 210 in FIG. 2. In FIG. 3, it is assumed that the word line signal WL having a high logic level indicates that the word line signal WL is active or present, and the word line signal WL having a low logic level indicates that the word line signal WL is idle or absent. It should be noted that the logic level at which the word line signal WL is active or idle is determined according to the actual applications. In some embodiments, the word line signal WL having a low logic level indicates that the word line signal WL is active, and the word line signal WL having a high logic level indicates that the word line signal WL is idle.

Referring to FIGS. 2 and 3 together, when the word line signal WL is active, the segmented word line generator 210 generates the segmented word line signal WL_segment according to the setting value REG_BL from the register 260. In some embodiments, the register 260 is disposed within the WL arbitrator 20 or other circuits of the memory device 100. Furthermore, by setting the register 260 corresponding to a burst length, the user can control the number of pulses of the segment word line signal WL_segment, and the setting value REG_BL represents the setting value of the register 260. In some embodiments, the setting value REG_BL is a power of 2, such as 2, 4, 8, 16, and the like. When the word line signal WL is active, the segmented word line generator 210 is configured to cut or segment the word line signal WL according to the clock signal CLK and the setting value REG_BL, so as to provide the segmented word line signal WL_segment. In other words, the segmented word line generator 210 is capable of segmenting the word line signal WL according to the setting value REG_BL, so as to generate the segmented word line signal WL_segment having the number of pulses corresponding to the setting value REG_BL. For example, if the setting value REG_BL is 4, the segmented word line generator 210 generates the segmented word line signal WL_segment of four pulses according to the word line signal WL. In some embodiments, the word line signal WL having a high logic level indicates that the word line signal WL is active, and the word line signal WL having a low logic level indicates that the word line signal WL is idle. Similarly, the segmented word line signal WL_segment having a high logic level indicates that the segmented word line signal WL_segment is active, and the segmented word line signal WL_segment having a low logic level indicates that the segmented word line signal WL_segment is idle. It is to be noted that the waveform of FIG. 3 is used as an example and is not intended to limit the invention. Moreover, the active time T1 of the word line signal WL is greater than the active time T5 of the segment word line signal WL_segment. In some embodiments, the active time T5 is the read or write time required for the PSRAM 10, such as 30 ns to 40 ns.

Referring back to FIG. 2, the frequency detector 220 detects whether the frequency of the clock signal CLK is lower than a specific frequency FL (not shown), and generates a detection signal FEQ_DET to the operation unit 230. In some embodiments, the frequency detector 220 uses another operational clock signal (not shown) to count the period of the clock signal CLK, so as to obtain the frequency of the clock signal CLK. Furthermore, the frequency of the operating clock signal is greater than the frequency of the clock signal CLK. In the embodiment, if the frequency of the clock signal CLK is higher than the specific frequency FL, the frequency detector 220 provides the detection signal FEQ_DET with a low logic level to the operation unit 230. Conversely, if the frequency of the clock signal CLK does not exceed (i.e., less than or equal to) the specific frequency FL, the frequency detector 220 provides the detection signal FEQ_DET with a high logic level to the operation unit 230.

The operation unit 230 includes an OR gate 235. The OR gate 235 is capable of generating the selection signal SEL according to the detection signal FEQ_DET and the setting value REG_set from the register 250. In some embodiments, the register 250 is disposed within the WL arbitrator 20 or other circuits of the memory device 100. In addition, by setting the register 250 corresponding to the smart refresh function, the user can control the memory device 100 to operate in the synchronous mode or the smart refresh mode, and the setting value REG_set represents a setting value of the register 250. In the embodiment, the setting value REG_set having a low logic level indicates that the memory device 100 is operating in the synchronous mode, that is, the smart refresh function corresponding to the register 250 is not set (i.e., the smart refresh function is disabled). Conversely, the setting value REG_set with a high logic level indicates that the memory device 100 is operating in the smart refresh mode, that is, the smart refresh function corresponding to the register 250 has been set (i.e., the smart refresh function is enabled). Therefore, when the detection signal FEQ_DET indicates that the frequency of the clock signal CLK is less than or equal to the specific frequency FL (e.g., FEQ_DET=High) or the setting value REG_set indicates that the memory device 100 is operating in the smart refresh mode (e.g., REG_set=High), the operation unit 230 is capable of providing the selection signal SEL with a high logic level to the selector 240. Conversely, when the detection signal FEQ_DET indicates that the frequency of the clock signal CLK exceeds the specific frequency FL (e.g., FEQ_DET=Low) and the setting value REG_set indicates that the memory device 100 is operating in the synchronization mode (e.g., REG_set=Low), the operation unit 230 is capable of providing the select signal SEL having a low logic level to the selector 240. The operation of the operation unit 230 will be described later. It should be noted that the logic gate 235 in the operation unit 230 and the logic levels of the detection signal FEQ_DET and the setting value REG_set are only used as an example and is not intended to limit the invention. The detailed circuit within the operation unit 230 and the logic levels of the detection signal FEQ_DET and the setting value REG_set can be determined according to the actual applications.

The selector 240 is configured to selectively provide the word line signal WL or the segment word line signal WL_segment as the internal word line signal WL_internal according to the selection signal SEL. In some embodiments, the selector 240 includes a multiplexer 245. In the embodiment, when the selection signal SEL is at a low logic level (i.e., the frequency of the clock signal CLK is higher than that of the specific frequency FL and the register 250 is not set to the smart refresh mode), the multiplexer 245 provides the word line signal WL as the internal word line signal WL_internal. Conversely, when the selection signal SEL is at a high logic level (i.e. the frequency of the clock signal CLK is less than or equal to that of the specific frequency FL or the register 250 is set to the smart refresh mode), the multiplexer 245 provides the segmented word line signal WL_segment as the internal word line signal WL_internal, so as to perform the refresh operation efficiently and flexibly.

Figure 4:
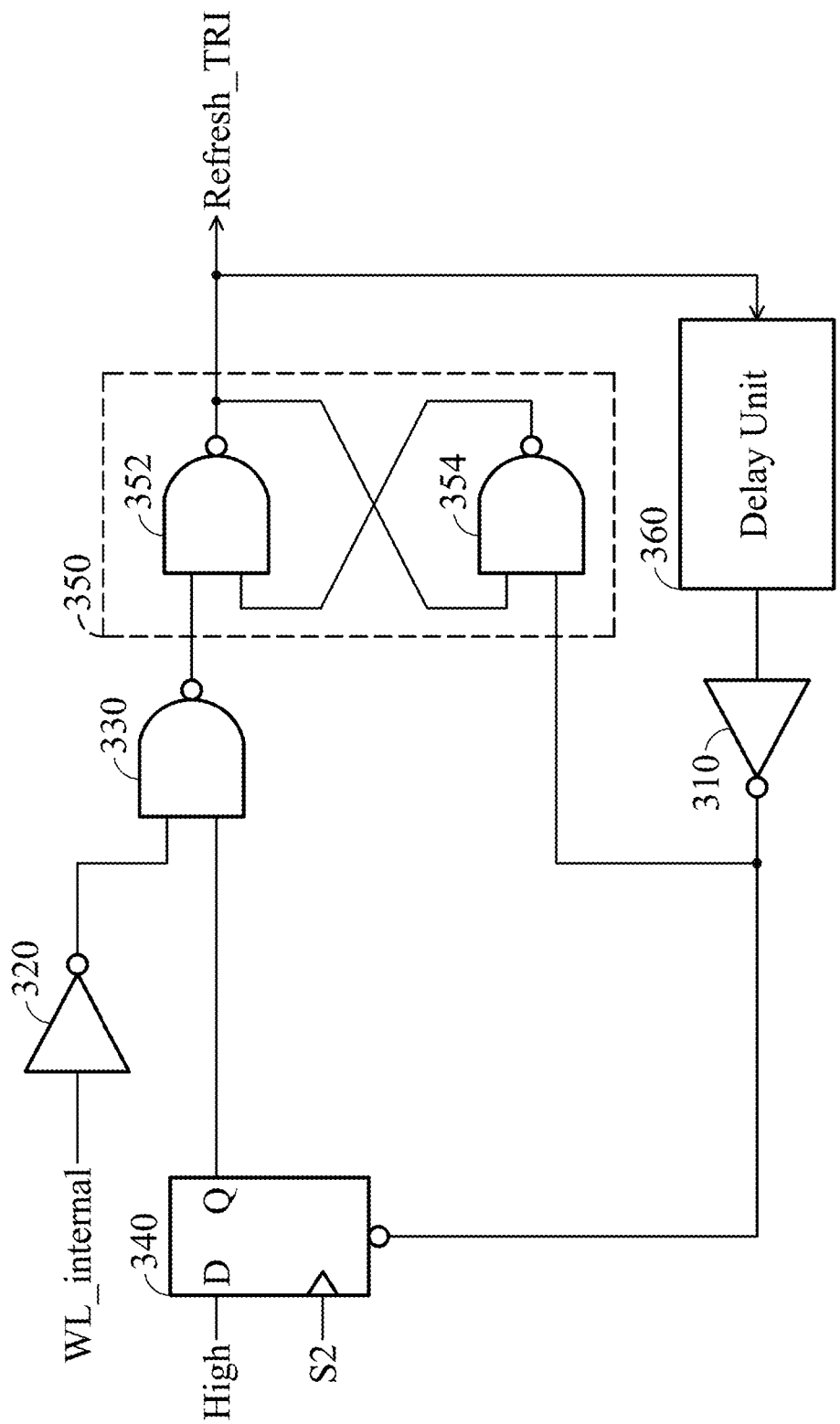
FIG. 4 shows the refresh trigger circuit of FIG. 1 according to an embodiment of the invention.

FIG. 4 shows the refresh trigger circuit 45 of FIG. 1 according to an embodiment of the invention. The refresh trigger circuit 45 includes an inverter 310, an inverter 320, a NAND gate 330, a flip-flop 340, a set-reset (SR) latch 350 formed by the NAND gates 352 and 354, and a delay unit 360. The internal word line signal WL_internal is input to the inverter 310. The high logic level "High" is input to the input terminal of the flip-flop 340, and the signal S2 from the self-refresh timer 30 is input to the clock terminal of the flip-flop 340. The refresh trigger signal Refresh_TRI is delayed by the delay unit 360 and inverted by the inverter 310, and then input to the set-reset latch 350 and the flip-flop 340. As described above, the signal S2 may be considered a refresh request to indicate that the self-refresh timer 30 has counted to a predetermined time of self-refresh. In some embodiments, the signal S2 is a pulse signal. When the signal S2 collides with the internal word line signal WL_internal (i.e., the pulse of the signal S2 occurs when the internal word line signal WL_internal is active), the set-reset latch 350 is capable of providing the refresh trigger signal Refresh_TRI according to the pulse of the signal S2 when the internal word line signal WL_internal is idle. Thus, it can be ensured that the refresh operation is performed when the internal word line signal WL_internal is idle. Therefore, the access operation will not be affect by the refresh operations.

Figure 5A:
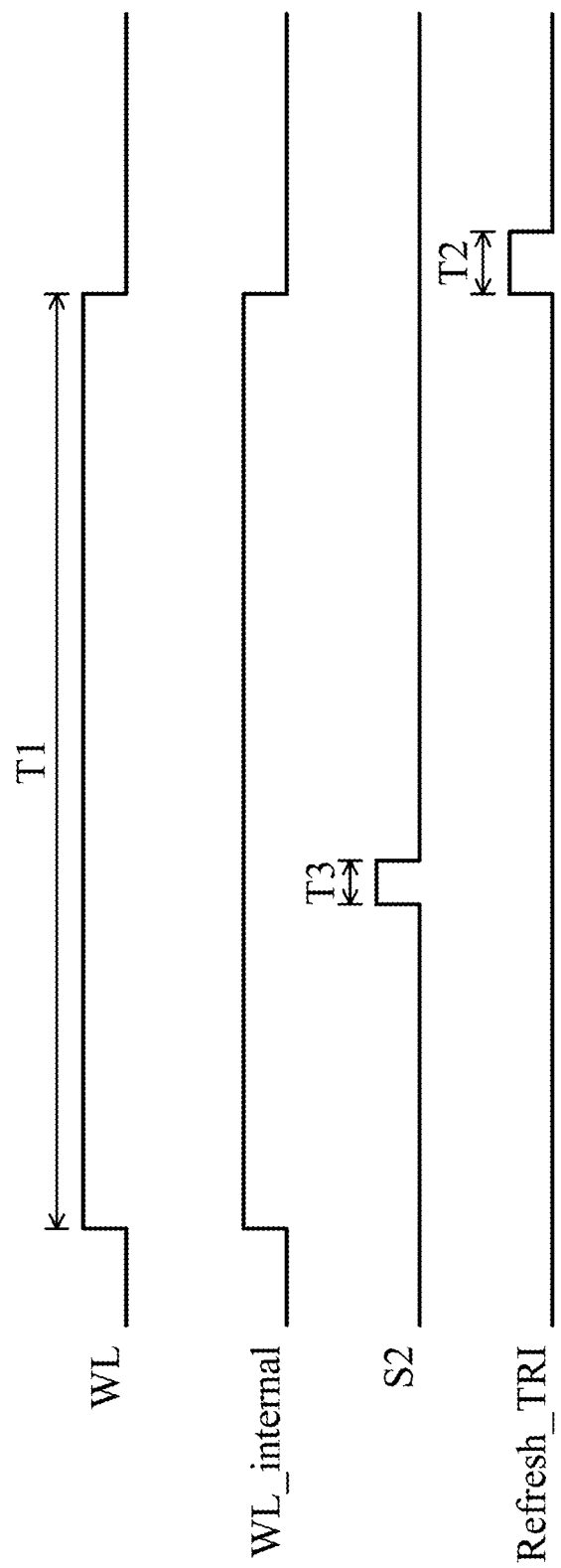
FIG. 5A is an exemplary waveform diagram illustrating the signals of the refresh trigger circuit of FIG. 4 in the synchronous mode.

FIG. 5A is an exemplary waveform diagram illustrating the signals of the refresh trigger circuit 45 of FIG. 4 in the synchronous mode. As described above, in the synchronous mode, the internal word line signal WL_internal is synchronized to the word line signal WL, for example, the internal word line signal WL_internal is the same or similar to the word line signal WL. In the embodiment, the word line signal WL has the same active period T1 as the internal word line signal WL_internal. In FIG. 5A, when the pulse of the signal S2 is present where the internal word line signal WL_internal is active, the refresh trigger circuit 45 provides the refresh trigger signal Refresh_TRI when the internal word line signal WL_internal is idle. Thus, the controller 40 of FIG. 1 is capable of generating the control signal Ctrl2 according to the refresh trigger signal Refresh_TRI, so as to perform a refresh operation on the PSRAM 10. In the embodiment, the pulse width of the signal S2 is T3, and the pulse width of the refresh trigger signal Refresh_TRI is T2. In some embodiments, the pulse width T2 of signal S2 is determined by the delay unit 360. In some embodiments, the pulse width T2 of the refresh trigger signal Refresh_TRI is determined by the number of PSRAM cells in the memory array 130 that are to be refreshed.

Figure 5B:
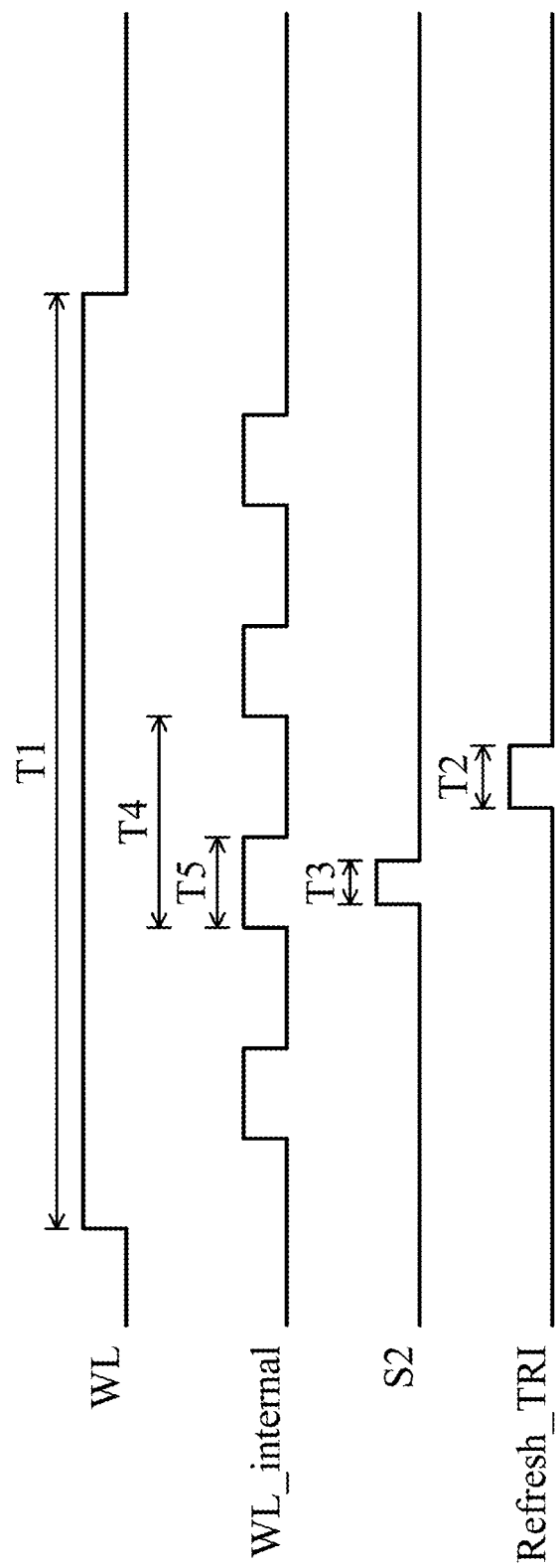
FIG. 5B is an exemplary waveform diagram illustrating the signals of the refresh trigger circuit of FIG. 4 in the smart refresh mode.

FIG. 5B is an exemplary waveform diagram illustrating the signals of the refresh trigger circuit 45 of FIG. 4 in the smart refresh mode. As described above, in the smart refresh mode, the internal word line signal WL_internal is synchronized to the clock signal CLK instead of the word line signal WL, so the waveform of the internal word line signal WL_internal is different from the word line signal WL. In the embodiment, the word line signal WL has an active period T1, and the internal word line signal WL_internal has the period T4 similar as the clock signal CLK. In some embodiments, the active period T1 is an even multiple of the period T4, such as T1=4×T4. In FIG. 5B, when the pulse of the signal S2 is present and the internal word line signal WL_internal is active, the refresh trigger circuit 45 is capable of providing the refresh trigger signal Refresh_TRI when the internal word line signal WL_internal is idle. Thus, the controller 40 of FIG. 1 is capable of generating the control signal Ctrl2 according to the refresh trigger signal Refresh_TRI, so as to perform a refresh operation on the PSRAM 10.

Referring to FIG. 5A and FIG. 5B together, compared with the synchronous mode, a refresh operation is performed in advance when the segmented word line signal WL_segment is idle (e.g., a low logic level). In other words, in the smart refresh mode, the refresh request can be flexibly and efficiently inserted when the segmented word line signal WL_segment is idle, so that the limitation that the conventional word line cannot be inserted a refresh operation under low frequency operation can be solved. Therefore, when the memory device 100 operates in the low frequency mode, a hidden refresh operation is performed without interrupting the burst read/write operation (e.g., switching the chip enable signal CE according to specifications). Therefore, the access speed of the memory device 100 can be accelerated, and the power consumption can be reduced. Furthermore, by adjusting the predetermined time of self-refresh in the self-refresh timer 30, the number of occurrences of the pulse of the signal S2 is increased. For example, the refresh trigger signal Refresh_TRI is provided once the internal word line signals WL_internal is idle. Therefore, more refresh operations can be performed in the smart refresh mode to ensure the correctness of data.

Figure 6:
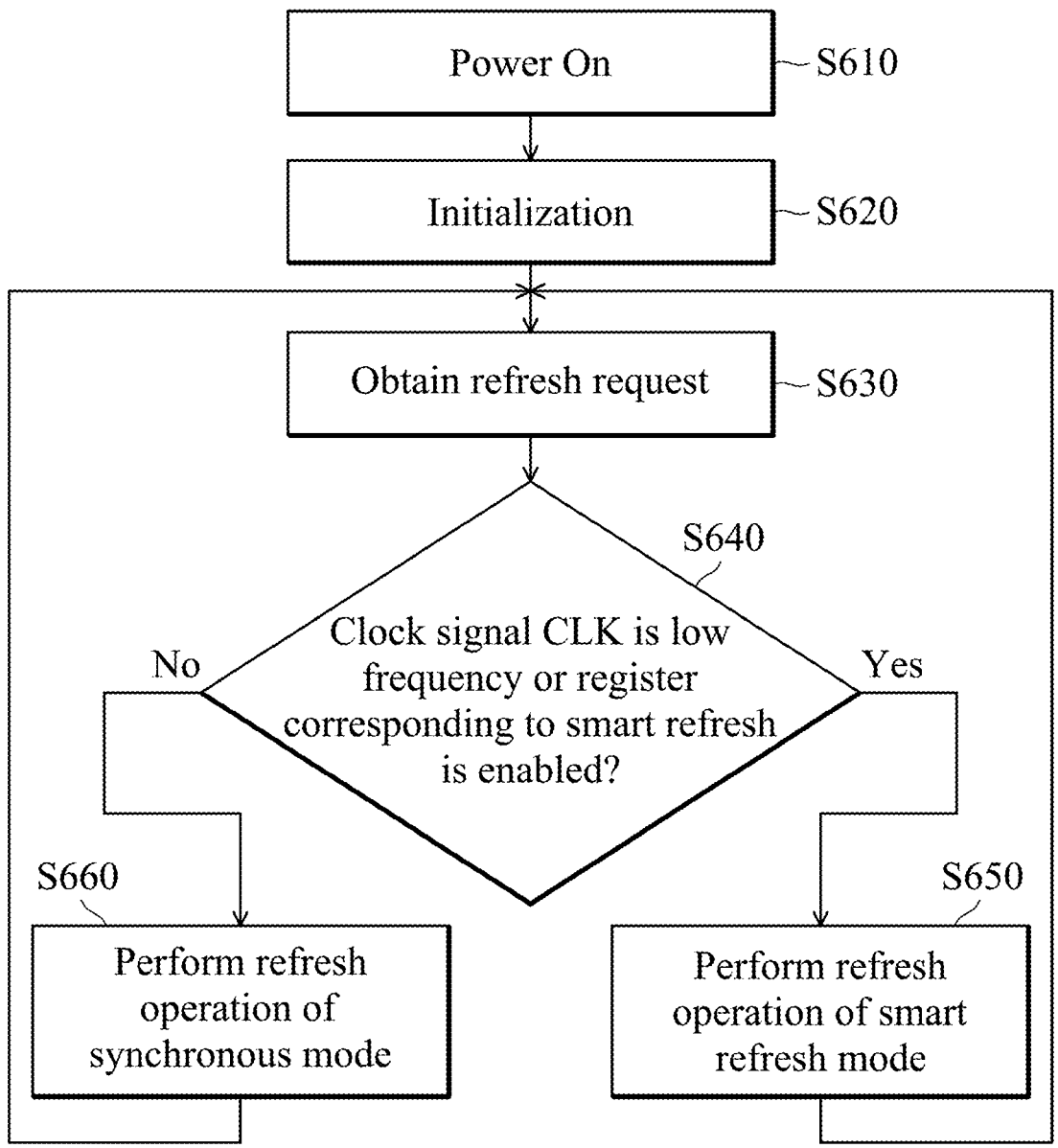
FIG. 6 shows a refresh method for a PSRAM according to an embodiment of the invention.

FIG. 6 shows a refresh method for a PSRAM (e.g., the PSRAM 10 of FIG. 1) according to an embodiment of the invention. Referring to FIGS. 1 and 6 together, first, in operation S610, the memory device 100 having the PSRAM 10 is powered on. Next, in operation S620, the memory device 100 performs an initialization operation. In the initialization operation, the registers within the memory device 100 can be set, so as to set (enable or disable) various functions of the memory device 100. Next, in operation S630, the controller 40 receives a refresh request (e.g., the signal S2) from the self-refresh timer 30. As described above, the self-refresh timer 30 is capable of periodically (a predetermined interval time for refresh) providing a refresh request. After receiving the refresh request, the refresh operation of the synchronous mode (operation S660) or the refresh operation of the smart refresh mode (operation S650) may be selectively performed on the PSRAM 10 according to the frequency of the clock signal CLK and the setting value of the register 250 (operation S640). As described above, when the detection signal FEQ_DET indicates that the frequency of the clock signal CLK exceeds a specific frequency FL (i.e., the memory device 100 operates at a high frequency) and the smart refresh function corresponding to the register 250 is disabled, the memory device 100 is operating in the synchronous mode. In the synchronous mode, the controller 40 provides the refresh trigger signal Refresh_TRI corresponding to the word line signal WL to perform a refresh operation on the PSRAM 10, as shown in FIG. 5A. Conversely, when the detection signal FEQ_DET indicates that the frequency of the clock signal CLK does not exceed the specific frequency FL (i.e., the memory device 100 operates at a low frequency) or the smart refresh function corresponding to the register 250 is enabled, the memory device 100 is operating in the smart refresh mode. In the smart refresh mode, the controller 40 provides the refresh trigger signal Refresh_TRI corresponding to the segmented word line signal WL_segment to perform a refresh operation on the PSRAM 10, as shown in FIG. 5B. Thus, in the smart refresh mode, the refresh request can be inserted while the segmented word line signal WL_segment is idle, and the hidden refresh operation can be performed without interrupting the access operation.

What is claimed is:

1. A memory device, comprising:
   a pseudo static random access memory (PSRAM);
   a word line arbitrator, receiving a word line signal, and segmenting the word line signal according to a burst length setting value, to obtain a segmented word line signal; and
   a refresh controller, providing a first refresh trigger signal corresponding to the word line signal to refresh the PSRAM in a synchronous mode, and providing a second refresh trigger signal corresponding to the segmented word line signal to refresh the PSRAM in a smart refresh mode,
   wherein the number of pulses of the segmented word line signal is determined by the burst length setting value.

2. The memory device as claimed in claim 1, further comprising:
   a frequency detector, detecting a frequency of the clock signal, so as to control the refresh control to operate in the synchronous mode or the smart refresh mode; and
   a register,
   wherein when the frequency of the clock signal exceeds a specific frequency, the refresh controller operates in the synchronous mode, and when the frequency of the clock signal does not exceed the specific frequency, the refresh controller operates in the smart refresh mode, wherein when the register is enabled, the refresh controller operates in the smart refresh mode, and when the register is disabled, the refresh controller operates in the synchronous mode.

3. The memory device as claimed in claim 1, wherein when the word line signal is active, the word line arbitrator provides the segmented word line signal having a plurality of pulses to the refresh controller, and when the word line signal is idle, the word line arbitrator stops providing the segmented word line signal having the pulses.

4. The memory device as claimed in claim 1, wherein an active time of the word line signal is greater than that of the segmented word line signal, wherein in the smart refresh mode, after counting a predetermined time when the word line signal is active and the segmented word line signal is idle, the refresh controller provides the second refresh trigger signal.

5. A refresh method for a pseudo static random access memory (PSRAM), comprising:
   in response to a burst length setting value, providing a segmented word line signal according to a word line signal; and
   selectively providing a first refresh trigger signal corresponding to the word line signal or a second refresh trigger signal corresponding to the segmented word line signal, to refresh the PSRAM,
   wherein the number of pulses of the segmented word line signal is determined by the burst length setting value.

6. The refresh method as claimed in claim 5, wherein the step of selectively providing the first refresh trigger signal corresponding to the word line signal or the second refresh trigger signal corresponding to the segmented word line signal further comprises:
   providing the first refresh trigger signal corresponding to the word line signal, to refresh the PSRAM when detecting that frequency of the clock signal exceeds a specific frequency; and
   providing the second refresh trigger signal corresponding to the segmented word line signal, to refresh the PSRAM when detecting that the frequency of the clock signal does not exceed the specific frequency;
   wherein the step of providing the second refresh trigger signal corresponding to the segmented word line signal, to refresh the PSRAM further comprises:
   providing the second refresh trigger signal after counting a predetermined time when the word line signal is active and the segmented word line signal is idle.

7. The refresh method as claimed in claim 5, wherein the step of selectively providing the first refresh trigger signal corresponding to the word line signal or the second refresh trigger signal corresponding to the segmented word line signal further comprises:
   providing the first refresh trigger signal corresponding to the word line signal, to refresh the PSRAM when detecting that a register is disabled; and
   providing the second refresh trigger signal corresponding to the segmented word line signal, to refresh the PSRAM when detecting that a register is enabled;
   wherein the step of providing the second refresh trigger signal corresponding to the segmented word line signal to refresh the PSRAM further comprises:
   providing the second refresh trigger signal after counting a predetermined time when the word line signal is active and the segmented word line signal is idle.

8. The refresh method as claimed in claim 5, wherein the step of providing the segmented word line signal according to the word line signal further comprises:

providing the segmented word line signal having a plurality of pulses when the word line signal is active; and stopping providing the segmented word line signal having the pulses when the word line signal is idle.

9. The refresh method as claimed in claim 5, wherein active time of the word line signal is greater than that of the segmented word line signal.

* * * * *